United States Patent [19]

Larsson et al.

[11] Patent Number: 5,694,423
[45] Date of Patent: Dec. 2, 1997

[54] METHOD AND APPARATUS FOR DETECTING AND CORRECTING MISCONVERGENCE OF A BLIND EQUALIZER

[75] Inventors: Patrik Larsson, Monmouth; Meng-Lin Yu, Morganville, both of N.J.

[73] Assignee: Lucent Technologies Inc., Murray Hill, N.J.

[21] Appl. No.: 692,554

[22] Filed: Aug. 6, 1996

[51] Int. Cl.$^6$ .............................. H03H 7/30; H03K 5/159
[52] U.S. Cl. ............................ 375/231; 375/232
[58] Field of Search .................... 375/231, 234, 375/235, 232; 364/724.2, 724.19

[56] References Cited

U.S. PATENT DOCUMENTS

| | | | |
|---|---|---|---|
| 5,230,007 | 7/1993 | Baum | 375/232 |
| 5,416,799 | 5/1995 | Currivan et al. | 375/232 |
| 5,455,819 | 10/1995 | Sugiyama | 375/232 |
| 5,517,435 | 5/1996 | Sugiyama | 364/724.19 |

OTHER PUBLICATIONS

S.U.H. Qureshi, "Adaptive Equalization," Proceedings of IEEE, v. 73, No. 9, pp. 1349–1387 (1985).

G.H. Im, et al., "Bandwidth-Efficient Digital Transmission Over Unshielded Twisted-Pair Wiring," IEEE Journal on Selected Areas in Communications, v. 13, No. 9, pp. 1643–1655 (Dec. 1995).

R. D. Gitlin, et al., Data Communications Principles (1992).

D.N. Godard, "Self-Recovering Equalization and Carrier Tracking in Two-Dimensional Data Communication Systems," IEEE Transactions on Communications, v. 28, No. 11, pp. 1867–1875 (Nov. 1980).

G.H. Im, et al., "51.84 Mb/s 16–Cap ATM LAN Standard," IEEE Journal on Selected Areas in Communications, vol. 13, No. 4, pp. 620–632 (May 1995).

*Primary Examiner*—Stephen Chin
*Assistant Examiner*—Betsy Lee Deppe

[57] ABSTRACT

Convergence of blind fractionally spaced equalizers is improved, and misconvergence is corrected by training the equalizers to detect convergence of one adaptive filter, copying the tap weights of the converged adaptive filter to the other adaptive filters and shifting the tap weights of the other adaptive filters according to the expected phase difference between the respective filters. In a two-dimensional orthogonal modulation scheme the converged weights of a first filter are copied to a second filter and shifted π/2. For the two dimensional orthogonal modulation scheme, the probability of a proper convergence can be increased by choosing initial tap weights for the two adaptive filters with a 3π/4 phase difference.

23 Claims, 2 Drawing Sheets

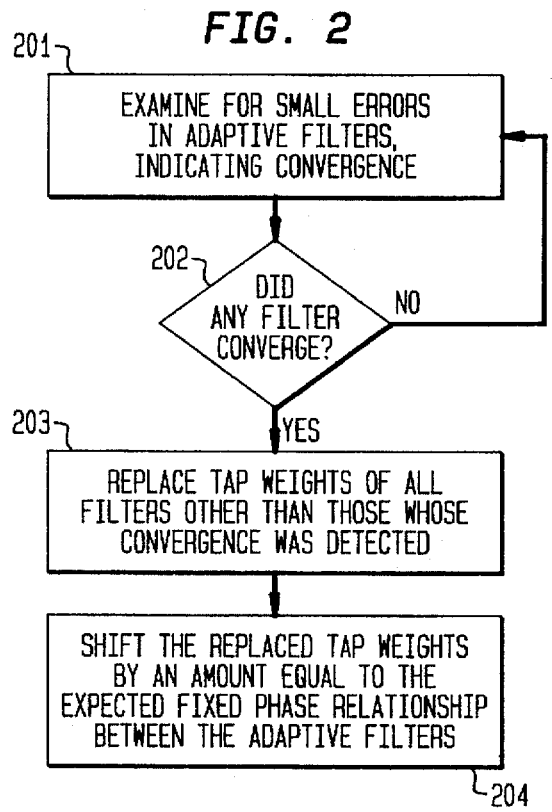
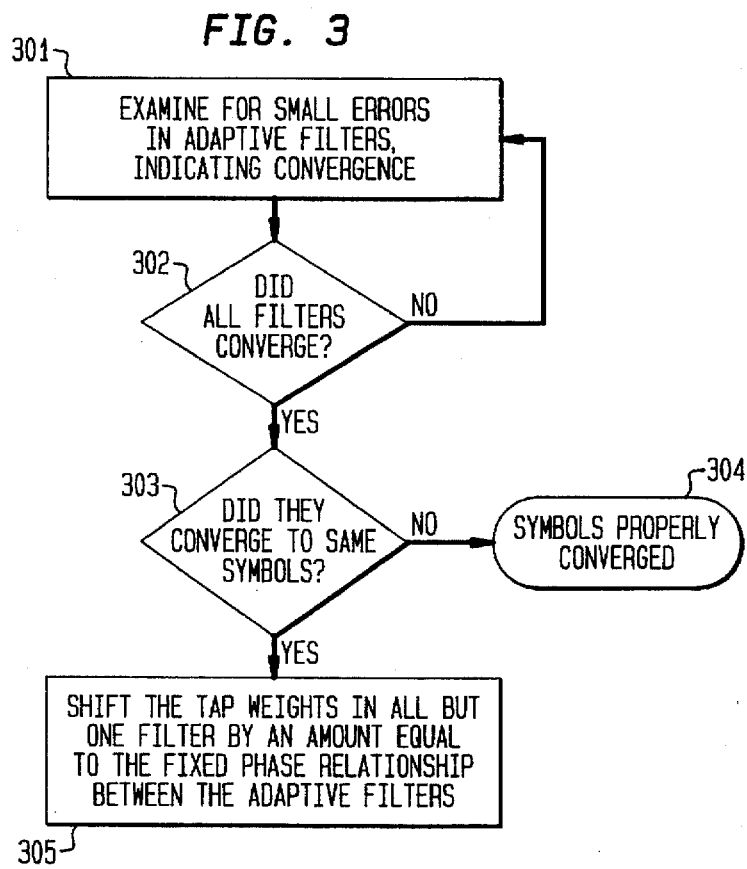

METHOD AND APPARATUS FOR DETECTING AND CORRECTING MISCONVERGENCE OF A BLIND EQUALIZER

FIELD OF THE INVENTION

This invention relates to blind equalization of a received signal. In particular the invention provides a method and means for detecting and correcting a variety of faulty convergence phenomena.

BACKGROUND OF THE INVENTION

In phase—and amplitude—modulated transmission schemes, the phase and amplitude of a signal are shifted to various combinations of values, each combination indicating a different set of transmitted bits. At the receiver, proper decoding includes detecting the various phase and amplitude combinations. In a two dimensional modulation scheme, the signal can be represented mathematically with an I component and a Q component of the signal, each of which is $\pi/2$ out of phase with respect to the other. The plot of these two components on a two dimensional graph for a set of received symbols results in a pattern referred to as a constellation.

Proper detection of the I and Q components of the signal is hampered by various sources of signal degradation. One such source is intersymbol interference where consecutive transmitted symbols interfere with each other. To compensate for intersymbol interference ("ISI"), especially in bandwidth-efficient communication receivers that operate with a data rate close to the channel capacity, best performance is achieved by implementing the equalizer as a fractionally spaced adaptive filter, described in S. U. H. Qureshi, "Adaptive Equalization," *Proceedings of IEEE*, v. 73, no. 9, pp. 1349–87 (1985), hereby incorporated by reference as if fully set forth herein. An adaptive filter can modify from time instant to time instant, the coefficients, also referred to as tap weights, used in the filter to remove ISI. The update of the tap weights is done to minimize an error at the output of the filter. This error is effectively a measure of the difference between the actual output of the filter and the expected output. The adaptive process continues until the error is at a minimum, in other words, the filter converges.

The convergence of an equalizer depends on many factors, e.g. initial tap weights, desired convergence rate, signal to noise ratio ("SNR") at the input and phase changes caused by a clock recovery circuit at the receiver, and can be accomplished with various adaptive algorithms. One such algorithm is a least mean square ("LMS") algorithm.

The adaptation of the tap weights in adaptive equalizers is based on an assumed correct decision about which symbol was received. This assumption is valid for equalizers with a training sequence for which the received symbol is in fact known a priori. Equalizers, however, are also used without the benefit of a training sequence, in which case the decision is not necessarily correct. These equalizers are referred to as blind equalizers, implying a possibility that the weights are erroneously updated. Although the possibility of a mistake exists, if the blind equalizer makes correct decisions for a sufficiently large set of received symbols, the equalizer will converge correctly.

If many erroneous decisions occur, the algorithm may converge to a local minimum or may not converge at all. One common local minimum for two dimensional ("2D") modulation schemes such as Quadrature Amplitude Modulation ("QAM"), where the information is transmitted by modulating both the amplitude and phase of the carrier signal, and Carrierless AM/PM ("CAP"), is that both the I and Q parts of the equalizer converge to tap weight settings such that both parts decode the same symbols, either the I symbols or the Q symbols. When the I and Q equalizers converge to similar tap weight settings, the resulting constellation appears as a diagonal line. CAP modulation is more fully described in G. H. Im, et al., "Bandwidth-Efficient Digital Transmission Over Unshielded Twisted-Pair Wiring," *IEEE Journal on Selected Areas in Communications*, v. 13, no. 9, pp. 1643–55 (December 1995), hereby incorporated by reference as if fully set forth herein.

Another local minimum occurs when only one of the I or Q parts converges correctly, but not the other. In this instance, the constellation will appear in a two dimensional graph as horizontal or vertical stripes. Yet, a third convergence failure occurs when the I and Q parts converge to tap weight settings such that the I equalizer decodes a symbol transmitted at time t while the Q equalizer decodes a symbol transmitted at time t−1. This failure is difficult to detect since the I and Q parts of the equalizer are passing their respective correct I and Q components, albeit not from the same time instant. In other words, instead of having a $\pi/2$ difference, the I and Q components have a $5\pi/2$ difference.

In the prior art, misconvergence of a blind equalizer is only recognized with higher level error correction techniques, for example, an error detecting/correcting decoder or higher levels in the communication protocol. The only method to overcome the local minima is to reset the system with the previous or a different set of taps as initial conditions and hope for correct convergence at the next trial. This method is disadvantageous as a low convergence probability leads to many restarts, of the system, and a consequently long convergence time.

SUMMARY OF THE INVENTION

Accordingly, it is an object of the present invention to increase the convergence probability of a blind equalizer without restarting the receiver system.

It is also an objective of the present invention to detect erroneous convergence of a blind equalizer, entirely within the equalizer, without having to rely on higher protocol layers.

In furtherance of these objectives misconvergence of a plurality of adapting filters is corrected by first detecting convergence of the weights of one adaptive filter. Those weights are then copied to the other adaptive filters. In a two dimensional modulation scheme, the weights of a first filter are copied to a second filter. The copied weights in the second filter are then shifted to corresponding taps which have the appropriate phase difference from the first filter, for example $\pi/2$ in an orthogonal modulation scheme. The copying and shifting can be implemented with hardware, or be computer implemented with appropriate software.

Avoiding misconvergence can also be enhanced by initializing the set of weights of each filter so that the phase difference between each filter is such that the worst error in one filter forces the least error in the other filters. Where there are two filters with $\pi/2$ phase relationship, initializing the filters to have a phase difference of substantially $0.757\pi$ is preferred.

BRIEF DESCRIPTION OF THE DRAWINGS

FIG. 2 is a flow chart of the general method of the present invention.

FIG. 3 is a flow chart of one embodiment of the present invention wherein both filters are converged onto the same symbol.

DETAILED DESCRIPTION OF THE INVENTION

Figure 1:
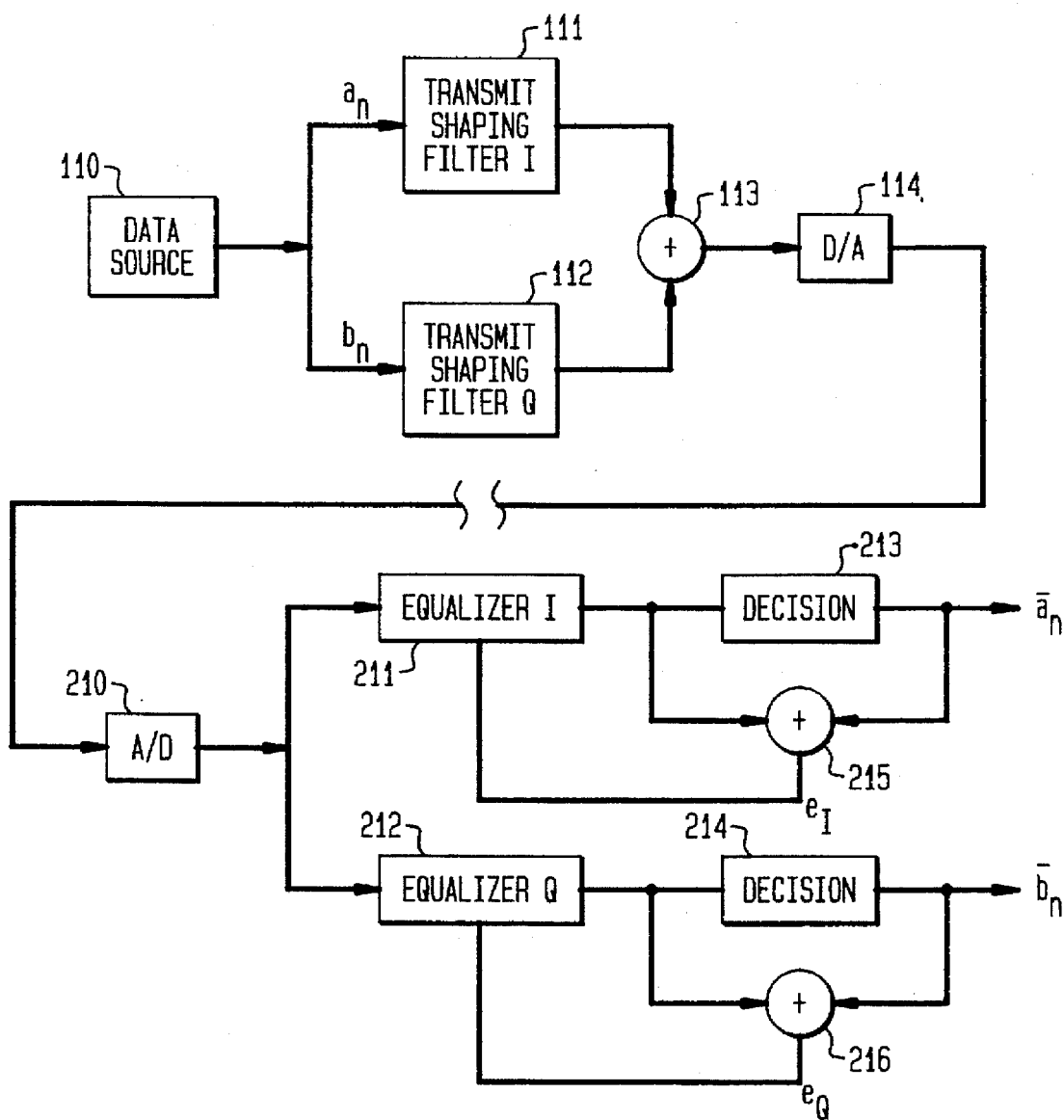
FIG. 1 is a block diagram showing a generalized transmitter transmitting a two dimensionally modulated signal, and a generalized receiver having two adaptive equalizers, for receiving the same signal.

For purposes of illustration, the following description of the invention will assume a two dimensional orthogonal modulation scheme utilizing square-root raised cosine pulses as modulating functions. However, it will be clear to those skilled in the art that the principles discussed herein apply as well to an N dimensional modulation scheme, which is not necessarily orthogonal and may have different modulating functions. Referring to FIG. 1 a simplified model of a CAP transmitter and receiver is shown. The data source 110 delivers I and Q symbols to the transmit shaping filters 111 and 112. These filters contain square-root raised cosine pulses modulated with a sine and a cosine function. The filter responses can be shown mathematically as:

$$f_I(t) = g(t) \cdot \cos(2\pi f_c t)$$

and $$f_Q(t) = g(t) \cdot \sin(2\pi f_c t)$$

where $$g(t) = \frac{\sin\left[\frac{\pi t}{T} \cdot (1-\alpha)\right] + \frac{4\alpha t}{T} \cdot \cos\left[\frac{\pi t}{T} \cdot (1+\alpha)\right]}{\frac{\pi t}{T} \cdot \left[1 - \left(\frac{4\alpha t}{T}\right)^2\right]}$$

and α denotes the excess bandwidth provided to the signal. The responses from filters 111 and 112 are combined in adder 113 and converted in analog to digital converter 114 before being transmitted. The sine and cosine functions make this modulation scheme a passband system without mixing at the output of the transmit filters as required with QAM. At the receiver, the analog signal passes through analog to digital converter 210 and then through equalizers 211 and 212, for retrieving the I and Q symbols, respectively.

If fixed matched filters were to be used at the receiver, the best filters would be FIR filters with taps equal to the time-reversed versions of $f_I(t)$ and $f_Q(t)$, as described in R. D. Gitlin, et at., *Data Communications Principles* (Plenum Press, 1992), hereby incorporated by reference as if fully set forth herein, assuming an unknown channel. As shown in FIG. 1, the receiver contains adaptive equalizers comprising decision device 213 and adder 215 for the I symbol and decision device 214 and adder 216 for the Q symbol performing the function of the matched filters. With adaptive filters, application specific noise and channel distortion can be compensated for to some extent. Similar to the transmitter, the mixing with sine and cosine is avoided compared to QAM system. The equalizers in FIG. 1 are fractionally spaced for improved ISI reduction and robustness to phase errors. As indicated, blind equalization is adopted to avoid a requirement on the protocol layer of having a training sequence.

Referring to FIG. 2, misconvergence of any of the above three conditions can be corrected without identifying the specific type of misconvergence with the training method of the present invention. In general the first step is to determine whether a time average of $e_I$ or $e_Q$ is small enough to indicate convergence of one of the filters as shown in block 201. Throughout this application it should be understood that the term "condition of convergence" or any like term is intended to indicate that one or more adaptive filters have output values from which one can deduce that the filter(s) has converged or will converge to a definite value. When convergence is identified as shown in block 202, the tap weights of the non-converged filters are discarded and replaced with a copy of the tap weights of the converged filter, as shown in block 203. The copied tap weights of the non-converged filters are then shifted according to the expected fixed phase relationship of the filters, as shown in block 204.

In addition to the general method, it is also possible to correct diagonal misconvergence by identifying the condition. Referring to FIG. 3, to detect diagonal convergence, we monitor the error at the output of each equalizer as shown in block 301. If the time average of both $e_I$ and $e_Q$ in FIG. 1 are small, the equalizer has converged, block 302. With simple accumulators, the absolute value of the errors are averaged over time. After detecting convergence, it is determined whether the convergence is diagonal, which can be implemented by measuring the statistics at the output of decision device 213 and 214, as shown generally in block 303. If the amplitude of the I and Q symbols are not the same then there is no diagonal convergence to correct as shown in block 304. If however, the I and Q symbols are substantially identical in magnitude, identical in magnitude but opposite in sign or the statistics show that the number of symbols received in the odd and even quadrants of the constellation differ greatly, diagonal convergence is detected. In one embodiment this can be implemented with a single N bit counter, reset to 0 at time t=0, and incremented by 1 for each symbol received in the 1st or 3rd quadrant. At time $t = 2^N \cdot T$, where T is the symbol interval, the counter should contain a number close to $2^N/2$ if both equalizers had converged correctly. A diagonal convergence is detected if the counter contains a number close to 0 or $2^N$. The counter's content also indicates whether the diagonal has positive or negative slope.

Once diagonal convergence is detected, the trivial yet unreliable method to restart the equalizers could be employed. A more reliable approach, however, is to shift the tap weights, as shown in block 305. In the case of diagonal convergence, both equalizers have converged to either $f_I$ or $f_Q$. As $f_I$ and $f_Q$ differ only by a phase shift of π/2 in the peak of this response, the result of modulating g(t) with sine and cosine, respectively, correct convergence requires that the modulation of one of the equalizers should be phase-shifted by π/2. Ignoring the effect of phase-shifting the taps with small amplitude, in other words weights with a corresponding absolute value of t greater than T, phase-shifting by π/2 is almost accomplished by shifting the tap weight positions by π/2. Mathematically, $$\cos(2\pi f_c t) = \sin(2\pi f_c t + \pi/2) = \sin\left[2\pi f_c \cdot \left(t + \frac{1}{4f_c}\right)\right].$$

Assuming $f_c = (1+\alpha)/2T$ and writing the corresponding time of tap i as i·T/k, where i is the index of tap i in the filter and k is the fractional spacing, the new set of weights with corresponding times $t_i^{new}$ are defined by $$t_i^{new} = t_i^{old} + \frac{1}{4f_c} = \frac{iT}{k} + \frac{T}{2(1+\alpha)} \ldots = \frac{(i+m)T}{k} + \epsilon = t_{i+m}^{old} + \epsilon$$

where m is selected to minimize $\epsilon$. For a T/3 spaced equalizer with an excess bandwidth of 50%, $\epsilon$ can be brought down to 0 by selecting m=1, which corresponds to a simple positional shift of the tap weights.

Simple shifting implies a restriction of selecting m as an integer. This means that the error $\epsilon$, might be quite large depending on $f_c$, the fractional spacing (k) and the excess bandwidth ($\alpha$). By interpolating the weight values between neighboring taps, it is possible to do noninteger shifting. Setting $W_k^{new} = (W_k^{old} + W_{k+1}^{old})/2$, where $W_k$ is the weight value at position k, corresponds to having m=1/2. The most general interpolation would be to set $W_k^{new} = (aW_k^{old} + bW_{k+1}^{old})/(a+b)$ where a and b are nonnegative numbers. For m=1, a is set to a value of 0 and b is set to a value of 1. m=1/2 is obtained by setting a and b to a value of 1. If a is set to a value of 3 and b to a value of 1 then m will equal 1/4. Simple interpolation with 1/2 and 1/4 can be easily implemented with addition and arithmetic shifting, implying low implementation cost. For example, assuming a T/2 spaced system with 100% excess bandwidth, an m of 1/2 is optimum. This indicates that m=1 will approximately give a phase-shift of $\pi$ instead of $\pi/2$ as desired. Shifting e.g., $f_I(t)$ by $\pi$ gives $-f_I(t)$, which cannot solve diagonal convergence or one dimensional convergence. Here it is necessary to do interpolation to get m=1/2.

The shifting of tap weights will not only shift the modulating sine and cosine functions, but also shift the phase of the pulse shaping function, g(t). However, close to the main tap at t=0, g(t) has an equivalent period of 4T. For the T/3 spaced equalizer above, shifting the taps one position corresponds to a phase shift of the g(t) function by $\pi/6$.

The small phase disturbance of g(t) and any nonzero $\epsilon$ will be taken care of by restarting the adaptation sequence with the copied/shifted tap weights as initial settings. A suitable sequence of adaptation for blind 2D equalizers is given in D. N. Godard, "Self-Recovering Equalization and Carrier Tracking in Two-Dimensional Data Communication Systems," *IEEE Transactions on Communications*, v. 28, no. 11, pp. 1867–75 (November 1980), hereby incorporated by reference as if fully set forth herein, and R. D. Gitlin, supra. Simulations show that the convergence rate after tap weight shifting is fast and convergence to the correct constellation is highly reliable.

In a misconvergence correcting system designed to monitor both $e_I$ and $e_Q$, the one dimensional misconvergence can be identified with a large difference between the time average of $e_I$ and $e_Q$. In this case, it is known that prior to shifting the tap weight, the weights of the filter having the least error must first be copied to the other filter.

As mentioned above, where $f_I$ and $f_Q$ have the correct phase relationship except that they decode symbols from different time instants, in other words, $a_n$ and $b_{n-1}$ detecting this misconvergence in a square constellation is impossible by only observing the output of the equalizer. For a non-square constellation, delay difference can be detected since non-valid symbols will show up at the output of the equalizer. For both square and non-square constellations, delay difference can be detected by locating the main taps in the I and Q equalizer. Correct convergence is obtained for a tap weight setting with the main taps spaced a distance apart, which is less than the fractional spacing of the corresponding equalizer. If the actual distance is different from the expected, the tap shifting described above can be employed to get correct convergence. Note that the tap weight shifting to solve the diagonal convergence may lead to the delay difference problem if shifting is not done in the proper direction. Therefore, one must first detect that one equalizer has converged, then copy its weights into the other equalizer and shift the weights.

The foregoing steps for correcting misconvergence depends on proper convergence of at least one filter. Thus it is advantageous to enhance the probability of correct convergence for one filter. One important element for correct convergence of blind equalizers is proper initial conditions. Since the equalizer is expected to converge to a state where the tap weights are similar to the transmit filter, it is intuitive to initialize the equalizer tap weights accordingly. However, since the phase offsets introduced by the channel and the clock recovery circuits are unknown, in the worst case scenario the initial conditions will be $\pi/4$ off from the expected values. Therefore, assuming that any of the two equalizers can take care of either the I or the Q symbols, and that the constellation is symmetric in both I and Q such that correct convergence is accomplished when one of the equalizers decodes I or –I symbols and the other decodes Q or –Q symbols, by adding $\pi/4$ to the fixed phase relationship of $\pi/2$ between the initial tap weight settings of the filters, the maximum possible phase offset for one channel to lock is limited to $\pi/8$. This increases the probability to lock at least one channel and if the other channel does not lock correctly, the tap weight shifting method is applied, giving reliable convergence.

The foregoing merely illustrates the principles of the present invention. Those skilled in the art will be able to devise various modifications, which although not explicitly described or shown herein, embody the principles of the invention and are thus within its spirit and scope.

What is claimed is:

1. A method for training a plurality of adaptive filters having an expected fixed phase relationship with respect to each other, each of said plurality of adaptive filters designed to recognize a symbol from a signal with a corresponding set of one or more weights, each of said one or more weights corresponding to a tap in each of said respective adaptive filters, said method comprising the steps of:

detecting a condition of convergence of any adaptive filter of said plurality of adaptive filters;

establishing in said plurality of adaptive filters other than said adaptive filter having a condition of convergence, a set of one or more weights phase shifted from said set of one or more weights of said adaptive filter having a condition of convergence, by the expected phase difference among said plurality of adaptive filters.

2. A method according to claim 1 wherein said plurality of adaptive filters are fractionally spaced and wherein said detecting step includes determining whether a selected tap of each of said adaptive filters are spaced a distance apart less than said fractional spacing of said adaptive filters.

3. A method according to claim 2 wherein said selected taps are main taps.

4. A method according to claim 1 wherein said establishing step further comprises the steps of:

replacing said corresponding set of one or more weights of each of said plurality of adaptive filters other than said adaptive filter having a condition of convergence with said set of one or more weights of said adaptive filter having a condition of convergence; and shifting each of said replaced sets of one or more weights by the expected phase differences among said plurality of adaptive filters.

5. A method according to claim 1 wherein said signal is modulated according to a two dimensional modulation scheme.

6. A method according to claim 5 wherein said plurality of adaptive filters equals two.

7. A method according to claim 6 wherein said two dimensional modulation scheme is orthogonal and said expected fixed phase relationship is $\pi/2$.

8. A method according to claim 1 wherein said shifting step comprises shifting said one or more weights of each of said sets of one or more weights from a respective first tap to a respective second tap while maintaining said expected fixed phase relationship between said plurality of adaptive filters.

9. A method according to claim 1 further comprising the step of initializing said set of one or more weights with an initial fixed phase relationship whereby the probability of correct convergence of at least one of said filters is increased.

10. A method according to claim 9 wherein said signal is modulated according to a two dimensional orthogonal modulation scheme and said initial fixed phase difference is $0.75\pi$.

11. A method for correcting misconvergence of one or more of a plurality of adaptive filters, each of said adaptive filters having an expected fixed phase relationship with respect to each other and designed to extract a symbol from a signal with a corresponding set of one or more weights, said method comprising the steps of:

detecting a condition of convergence of each of said plurality of adaptive filters;

determining whether each of said sets of one or more weights for each of said plurality of adaptive filters is substantially identical so as to indicate a condition of diagonal convergence; and shifting said set of one or more tap weights of each of said plurality of adaptive filters other than a first adaptive filter of said plurality of adaptive filters, so that each of said sets of tap weights have a phase relationship with respect to each other corresponding to said expected fixed phase relationship of each of said corresponding adaptive filters.

12. A method according to claim 11 wherein said determining step further comprises the steps of:

counting the number of said extracted symbols from a set of N extracted symbols, received in the first or third quadrants of a constellation of said N extracted symbols; and determining whether said number is closer to a value of either 0 or $2^N$, than to $2^N/2$.

13. A method according to claim 11 wherein said shifting step includes interpolating neighboring tap weights of each of said sets of tap weights being shifted such that a new weight $W_k^{new}$ is equal to $(a \cdot W_k^{old} + b \cdot W_{k+1}^{old})/(a+b)$, where a and b are non-negative numbers.

14. A method according to claim 11 wherein said signal is modulated according to a two dimensional modulation scheme.

15. A method according to claim 14 wherein said two dimensional modulation scheme is orthogonal and said expected fixed phase relationship is $\pi/2$.

16. A method according to claim 11 further comprising the step of initializing said set of one or more weights with an initial phase relationship whereby the probability of correct convergence of at least one of said filters is increased.

17. A method according to claim 16 wherein said signal is modulated according to a two dimensional orthogonal modulation scheme and said initial phase relationship is $0.75\pi$.

18. An improved blind equalizer comprising a plurality of fractionally spaced adaptive filters having an expected fixed phase relationship with respect to each other, each of said plurality of adaptive filters designed to extract a symbol from a signal with a corresponding set of one or more weights, and each of said one or more weights corresponding to a tap in said adaptive filter, wherein said improvement comprises:

a detector for detecting a condition of convergence of any adaptive filter of said plurality of adaptive filters, said adaptive filter having a condition of convergence and having a converged set of one or more weights;

means for replacing said corresponding set of one or more weights of each of said plurality of adaptive filters with said converged set of one or more weights; and means for shifting said set of one or more weights of each of said plurality of adaptive filters other than said converged set of one or more weights of said adaptive filter having a condition of convergence, by their respective expected fixed phase difference between each of said plurality of adaptive filters.

19. An improved blind equalizer according to claim 18 wherein said detector includes:

means for detecting a main tap in each of said plurality of adaptive filters; and means for determining whether said main taps are spaced a distance apart which is less than said fractional spacing of said adaptive filters.

20. An improved blind equalizer comprising a plurality of adaptive filters, each of said adaptive filters having an expected fixed phase relationship with respect to said plurality of adaptive filters and designed to extract a symbol from a signal with a corresponding set of one or more weights, wherein said improvement comprises:

a detector for detecting convergence of each of said plurality of adaptive filters to a set of one or more weights;

means for determining whether each of said sets of one or more weights for each of said plurality of adaptive filters is substantially identical so as to indicate a condition of diagonal convergence; and means for shifting said set of one or more weights of each of said plurality of adaptive filters other than a first converged adaptive filter of said plurality of adaptive filters, by their respective expected phase difference.

21. An improved blind equalizer according to claim 20 wherein said means for determining comprises an N bit counter reset to a zero value at an initial time and incremented for each of said symbols received in the first or third quadrants of a constellation of said received symbols.

22. An improved blind equalizer according to claim 20 wherein said means for shifting includes means for interpolating neighboring tap weights of each of said sets of tap weights being shifted such that a new weight $W_k^{new}$ is equal to $(a \cdot W_k^{old} + b \cdot W_{k+1}^{old})/(a+b)$, where a and b are non-negative numbers.

23. A method for increasing the probability of correct convergence of an adaptive equalizer operated on a signal modulated according to a two dimensional orthogonal modulation scheme, and having a set of adaptable tap weights, by initializing said set of adaptable tap weights with an initial fixed phase relationship of $0.75\pi$.

* * * * *